United States Patent [19]
Josephs et al.

[11] 4,413,196
[45] Nov. 1, 1983

[54] THREE JOSEPHSON JUNCTION DIRECT COUPLED ISOLATION CIRCUIT

[75] Inventors: Richard M. Josephs, Willow Grove; Tsing-Chow Wang, Norristown, both of Pa.

[73] Assignee: Sperry Corporation, New York, N.Y.

[21] Appl. No.: 298,148

[22] Filed: Aug. 31, 1981

[51] Int. Cl.³ ............................................ H03K 19/195
[52] U.S. Cl. ..................................... 307/462; 307/306
[58] Field of Search ............... 307/245, 306, 462, 476; 357/5; 365/162

[56] References Cited
U.S. PATENT DOCUMENTS
4,274,015  6/1981  Faris ...................................... 307/306
4,313,066  1/1982  Gheewala ............................ 307/306

Primary Examiner—John Zazworsky
Attorney, Agent, or Firm—John B. Sowell; Thomas J. Scott; Marshall M. Truex

[57] ABSTRACT

A two branch, three Josephson junction gating circuit is provided with a plurality of inputs to enable the circuit to be operated as a high-gain logic OR gate. The circuit is arranged to provide a larger operating window area and to provide an improved and optimized gain characteristic by selectively switching ON the Josephson junctions in the circuit.

11 Claims, 4 Drawing Figures

THREE JOSEPHSON JUNCTION DIRECT COUPLED ISOLATION CIRCUIT

BACKGROUND OF THE INVENTION

1. Field of the Invention

This invention relates to superconductive Josephson junction logic circuits. More particularly, the circuit relates to an improved logic OR gate circuit for performing logic functions.

2. Description of the Prior Art

This invention is an improvement of Josephson junction superconductive circuits of the type designed to be implemented as logic elements on large scale integrated (LSI) or very large scale integrated (VLSI) circuits. More particularly, the present invention is an improvement of U.S. Pat. No. 4,051,393 examined in Class 307, subclass 306. This prior art patent teaches a superconductive circuit having two parallel branches with an appropriately terminated output. Each of the two parallel branches contain one Josephson junction and the input to output loop circuit contains at least one resistor which provides appropriate input biasing and also improves the dynamic characteristics of the circuit by damping out undesired resonances. This prior art circuit provides modest gain and modest fan-out. For practical purposes, the gain of this circuit is less than two, thus, is not useful for more than one fan-out drive line.

An improved circuit of the above-basic patent is shown in IEEE, Transactions on Magnetics, Volume 15, No. 6, November 1979 at pages 1876-1879. This prior art circuit has been referred to as the Josephson Atto-Weber Switch (JAWS). This circuit employs two branches wherein one of the branches has a single Josephson junction and the other branch has a Josephson junction with a resistor. This article at FIG. 1 illustrates a two input logic driver which employs two power supplies and shows multiple output load resistors. This circuit has been examined and the gain at the output load is insufficient to drive more than one identical logic element with any margin of safety.

A further improvement of the above basic circuit shown in this application at FIG. 1, is disclosed in IEEE, International Electron Devices meeting, Washington, D.C., Dec. 3-5, 1979 at pages 482-484. This Josephson junction circuit has been referred to as Josephson Direct Coupled Logic or DCL and comprises an improvement over JAWS in that it includes a second resistor in the second or output branch which enables the circuit to be operated on one power supply rather than two. This basic device is employed as a logic module building block such as an OR and AND gate as in the present invention to be described more fully hereinafter. This DCL circuit provides the same output power as JAWS and is also insufficient to drive more than one identical logic element with any margin of safety.

Accordingly, it would be desirable to provide a new and novel Josephson junction circuit which can be used as a logic module building block. The novel module building block should be capable of having multiple inputs and also be capable of driving identical multiple outputs with a margin of safety.

SUMMARY OF THE INVENTION

It is a principal object of the present invention to provide a novel Josephson junction logic module building block circuit.

It is another principal object of the present invention to provide a Josephson junction circuit having multiple inputs and a plurality of stable high-gain outputs capable of driving at least three identical output loads with sufficient margin of safety.

It is yet another object of the present invention to provide a Josephson junction circuit having a larger and improved operating window area.

It is yet another object of the present invention to provide a Josephson junction circuit which allows the simultaneous optimization of the operating window area and the output gain.

It is a general object of the present invention to provide a simplified Josephson junction circuit which can be easily implemented as an integrated circuit having thousands of logic module building blocks on a single integrated circuit chip.

According to these and other objects of the present invention there is provided a Josephson junction circuit having a plurality of signal inputs connected to a common input node and a plurality of output loads connected to a common output node. A biasing current source and a low reference or ground voltage is provided. The input or first circuit branch comprises a first and a third Josephson junction and a first resistor connected in series between the current source and the ground voltage. A sink resistor is connected between the signal input node and the ground voltage and is in parallel with the first Josephson junction. The output or second circuit branch comprises a second Josephson junction and a second branch resistor in series between the current source and the ground voltage. A signal output node is provided intermediate said second Josephson junction and said second branch resistor. The output loads are connected between the signal output node and the ground voltage and are arranged in parallel with the second Josephson junction. The critical currents of the three Josephson junctions are selectively predetermined to cause the switching sequence of the Josephson junctions to occur in numerical order of the junctions.

DESCRIPTION OF THE PREFERRED EMBODIMENT

The term "Josephson junction" as used in the application shall mean any two superconducting electrodes separated by a very thin oxide barrier and operated near four degrees kelvin temperature. The Josephson junction is capable of conducting a critical amount of current $I_0$ before developing a voltage across the electrodes.

The term "operating window" or "operating window area" as used in this application shall mean the area of a curve in which the Josephson junction is switched ON in a biasing current versus input current diagram.

The term "threshold" as used in this application shall mean the point at which the Josephson junction device first becomes switched ON as defined on a biasing current versus input current diagram. The threshold shall also be defined as the boundary of the operating window area.

Figure 1:
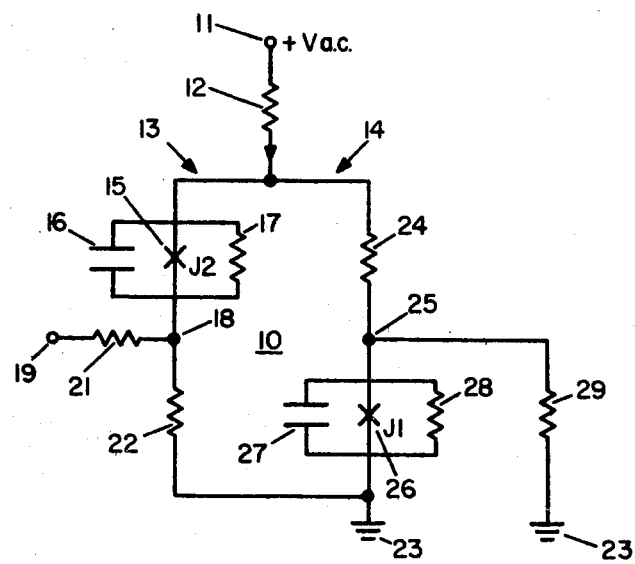
FIG. 1 is a logic circuit diagram showing the elements and/or equivalent circuit elements of a prior art direct coupled logic (DCL) Josephson junction circuit.

Refer now to FIG. 1 showing a prior art direct couple logic (DCL) circuit. The DCL circuit 10 is provided with alternating current source 11 which is applied via the current source resistor 12 to the first branch 13 and the second branch 14. The first branch 13 comprises a second Josephson junction 15 which is shown having an equivalent circuit component of capacitance 16 and resistance 17. The Josephson junction 15 is connected in series with a first branch resistor 22 which is connected to the low reference voltage or ground 23. Intermediate the Josephson junction 15 and the first branch resistor 22 there is provided an input signal node 18 which is connected to the input signal point 19 via an input resistor 21.

The second branch of the DCL circuit 10 comprises a second branch resistor 24 and a first Josephson junction 26 connected in series intermediate the current source 11 and the ground voltage 23. The Josephson junction 26 is shown as an equivalent circuit having capacitance 27 and resistance 28. The output node 25 is provided intermediate the second branch resistor 24 and the first Josephson junction 26 and is connected to the output load impedance 29 which is in parallel with the first Josephson junction 26.

It is well known that during the operation of the DCL circuit 10 that the biasing current being applied at current source 11 is split between the two branches 13 and 14. The input signal current at input signal point 19 is split at node 18 and part passes through junction 15 and junction 26 causing a greater amount of current to appear at the first junction 26 and the first Josephson junction 26 switches before the second Josephson junction 15 can switch.

The gain of the prior art DCL circuit 10 is defined by the amount of current flowing through the output load impedance 29 divided by the input current flowing through the input resistor 21. It has been determined that this prior art circuit can develop approximately a gain of 1.5 when driving an identical type of circuit. Thus, it will be understood that the fan-out of this prior art circuit is not capable of driving two identical loads and still maintain safety of operation.

Figure 2:
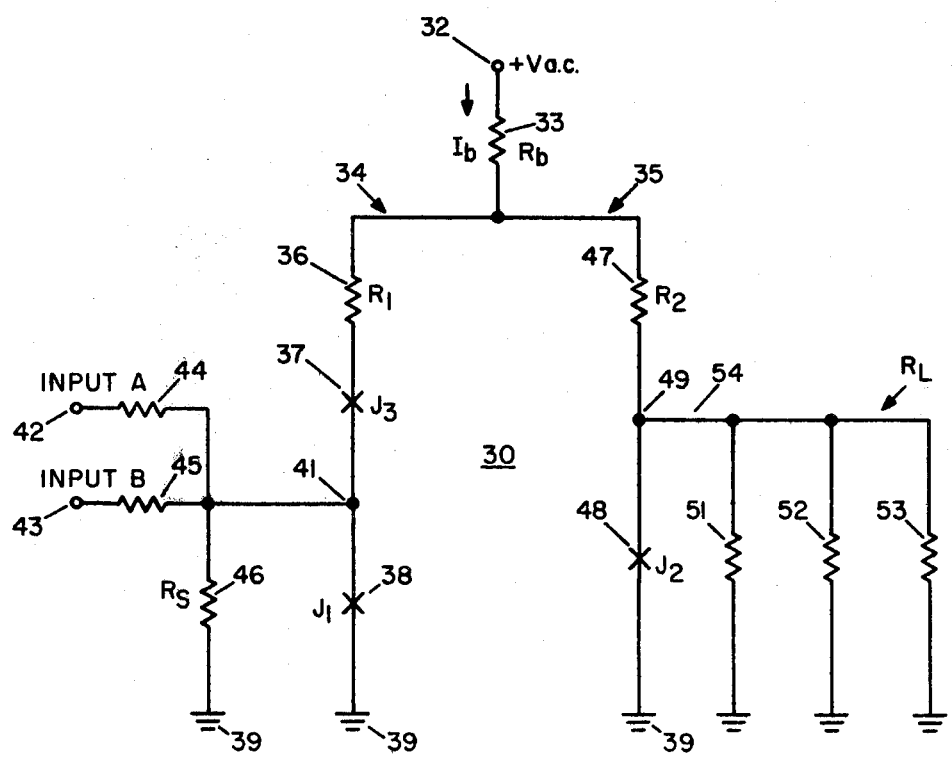
FIG. 2 is a logic circuit diagram showing the elements and/or equivalent circuit elements of the present invention Josephson junction circuit.

Refer now to FIG. 2 showing the present invention Josephson junction circuit 30. The circuit 30 comprises an a.c. current source 32 and a current source resistor 33 connected to a first branch 34 and a second branch 35. The first branch 34 has a first branch $R_1$ resistor 36, a third Josephson junction 37 and a first Josephson junction 38 connected in series between the current source 32 and the low reference voltage or ground 39.

The input signal node 41 is connected intermediate the first and third Josephson junctions 38 and 37. The input signal points 42 and 43 are connected to the input signal node 41 via their respective input resistors 44 and 45. A sink resistor 46 is connected between the input signal node 41 and ground 39 and is in parallel with the first Josephson junction 38. After all of the Josephson junctions in the circuit 30 have switched ON, the input currents being applied at the inputs 42, 43 are diverted to ground through the sink $R_s$ resistor 46.

The second branch 35 is connected in series between the current source 32 and ground 39. The second branch 35 comprises a second branch $R_2$ resistor 47 in series with the second Josephson junction 48. Intermediate the second branch resistor 47 and second Josephson junction 48 there is provided an output signal node 49 which is connected to the output load impedance. The output load impedance comprises a plurality of output loads shown as resistors 51, 52 and 53.

The gain of the Josephson junction circuit 30 is defined by the output current at line 54 divided by the input current at one of the inputs 42 or 43. In the operation of the circuit 30 the biasing current $I_b$ is applied to current source 32 and splits between the branches 34 and 35. In the preferred embodiment circuit of the present invention the $J_1$, $J_2$ and $J_3$ Josephson junction devices 38, 48 and 37 switch sequentially. Thus, the first Josephson junction 38 will switch ON first. Before the Josephson junction 38 switches ON, the inputs at points 42, 43 are effectively connected to ground 39 through the superconducting Josephson junction 38. When the Josephson junction 38 switches ON, it changes to its high impedance state thus causing the input current and the biasing current $I_b$ to redistribute themselves in the branches 34 and 35. The redistribution of current in these branches causes the second Josephson junction 48 to switch ON and then the third Josephson junction 37 to switch ON in a manner similar to that explained with respect to the prior art DCL circuit 10. It will be understood that a small amount of input current at input points 42 or 43 will be diverted into the first Josephson junction 38 to switch it before any appreciable amount of current is diverted into the third Josephson junction 37. Once the small amount of current has started the sequence of switching operations, the full amount of current available at inputs 42 and 43 is available to continue the switching operation, thus, the gain of the novel Josephson junction circuit 30 is enhanced. While the prior art circuit 10 can be shown to have a gain of approximately 1.5, the improved novel Josephson junction circuit 30 can be shown to have a gain of approximately 3.5 for effective safety of operation.

Figure 3:
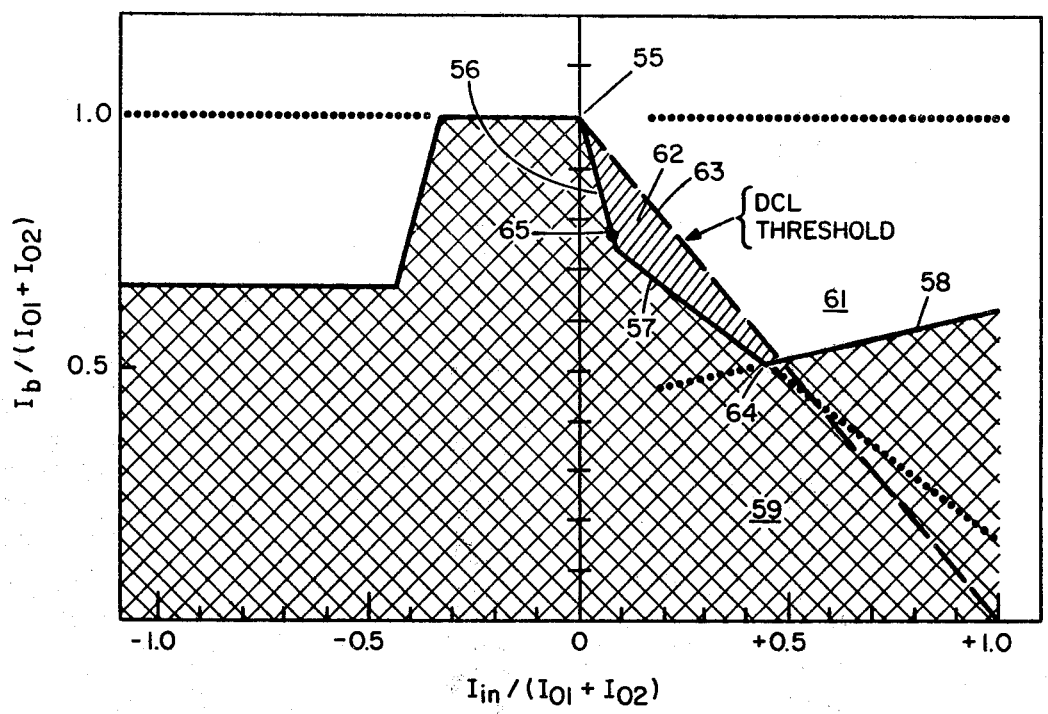
FIG. 3 is a diagram illustrating the operating window area and the threshold of the present invention Josephson junction circuit shown in FIG. 2.

Refer now to FIG. 3 illustrating the operating window area and the threshold curve of the Josephson junction circuit 30 of FIG. 2. The left-hand portion of the drawing showing negative input current $I_{in}$ will not be relevant to the explanation of the present invention logic circuit. The right-hand cross-hatched region 59 showing positive input current $I_{in}$ represents the zero voltage state of the Josephson junction circuit 30. In this zero voltage region 59, the combination of the biasing current $I_b$, at source 32 plus the input current $I_{in}$ at the input points 42, 43 is insufficient to initiate switching of the Josephson junction circuit 30.

Point 55 represents the minimum biasing current $I_b$ in the absence of an input signal $I_{in}$ which is capable of initiating switching of the Josephson junction circuit 30. Lines 56, 57 and 58 represent the locus of points or values where the Josephson junction circuit 30 is capable of switching. Once the point of operation passes out of the cross-hatched area 59 into the open area 61 or into the shaded area 62, the Josephson junction circuit 30 will switch ON all three of its junction devices $J_1$, $J_2$ and $J_3$.

Line 63 represents the locus of points or values wherein the Josephson junction circuit 10 of FIG. 1 is capable of switching ON. Thus, it will be understood that the shaded region 62 represents the area of operation in which less input current $I_{in}$ is required to initiate switching of the present invention Josephson junction circuit 30.

The abscissa showing the input current $I_{in}$ has been normalized by dividing by the sum of the critical currents $I_{01}$ plus $I_{02}$ of the first and second Josephson junctions 38 and 48 respectively. The critical current $I_0$ of a Josephson junction is defined as the maximum current that the Josephson junction will carry and remain in the zero voltage state. In a similar manner, the biasing current $I_b$ has also been normalized by dividing by the sum of the critical currents $I_{01}$ and $I_{02}$ of the same first and second Josephson junctions 38 and 48.

In order to explain the optimization of the Josephson junction 30, it is necessary to define two additional points in FIG. 3. The intersection of the afore-mentioned lines 57 and 58 define a point 64 which shall be designated as $I_{lobe}$.

Figure 4:
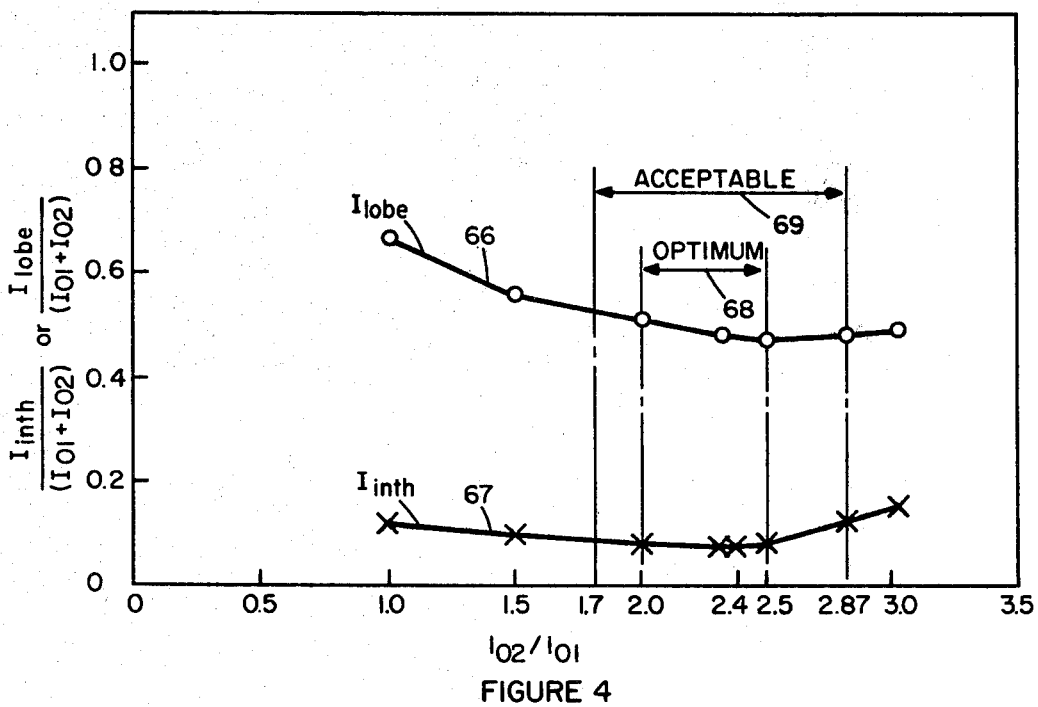
FIG. 4 is a diagram illustrating the optimization of the afore-mentioned operating window area and the output gain of the present invention Josephson junction circuit of FIG. 2.

Point 65 on line 56 represents a point where the normalized biasing current $I_b$ value is seventy-five percent of the sum of $I_{01}+I_{02}$ and the normalized input signal current $I_{in}$ is at a value $I_{inth}$ shown on FIG. 4 as an input current threshold.

Refer now to FIG. 4 which is a diagram illustrating the optimization of the operating window and the output gain of the present invention. Curve 66 represents a series of points or values of $I_{lobe}$ as a function of the ratio of the critical currents $I_{02}/I_{01}$ of the second Josephson junction 48 divided by the first Josephson junction 38. It will be noted that the curve 66 passes through a minimum point at approximately at a value of 2.5 for the ratio of critical currents $I_{02}/I_{01}$ of the Josephson junctions. Curve 67 represents a series or points or values for the optimum input current $I_{inth}$ as a function of the ratio of the critical currents $I_{02}/I_{01}$ of the second and first Josephson junctions 48 and 38. It will be noted that the minimum value for $I_{inth}$ occurs at approximately 2.4 on curve 67.

For optimum operation of the Josephson junction circuit 30, it is desirable that the minimum points on curves 66 and 67 be within the optimum operating range. The optimum operating range 68 embraces the ratio of critical currents $I_{02}/I_{01}$ of the Josephson junctions 48 and 38 as shown on FIG. 4. A fifteen percent deviation from the optimum range 68 defines the acceptable range 69. The optimum range 68 is defined as 2.0 to 2.5 and the acceptable range 69 is defined as 1.7 to 2.87 for both the optimum value of $I_{lobe}$ and $I_{inth}$.

In the preferred embodiment of the Josephson junction circuit 30 shown in FIG. 2, there is a desirable relationship between the product of the resistors 36 and 47 in the first branch 34 and the second branch 35. It is desired that the product of the $R_1$ first resistor 36 multiplied by the critical current $I_{01}$ of the first Josephson junction 38 be substantially equal to the product $R_2$ of the second resistor 47 in the second branch 35 multiplied by the critical current $I_{02}$ of the second Josephson junction 48. This is to say that the product of $R_1 \times I_{01} = R_2 \times I_{02}$. Also in the preferred embodiment of the present invention, the critical currents $I_{01}$, $I_{03}$ of the first and the third Josephson junctions 38 and 37 respectively, are substantially equal and $I_{02}$ is approximately twice $I_{01}$. The critical current of the Josephson junctions of the present invention is determined by the material from which the Josephson junction device is made and the size of the junction as is well known in this art. The $R_b$ biasing resistor 33 is preferably about four times $R_L$ the load resistance 51, 52, 53.

When $R_1$, $R_2$, $R_s$, $R_L$ and $R_b$ are 0.6 ohms, 0.3 ohms, 1.0 ohms, 5 ohms and 24 ohms, the biasing current $I_b$ is made equal to 0.7 ($I_{01}+I_{02}$) or 420 microamps where $I_{01}$ and $I_{02}$ are 200 and 400 microamps respectively. As shown on FIG. 3 at point 65, the application of approximately 65 microamps at either input 42 or 43 is sufficient to cause the first Josephson junction 38 to enter the operating window area 62 and initiate switching of the circuit 30. The output current at line 54 is approximately 300 microamps, thus, the fan-out or gain is substantially in excess of three with a reasonable margin of safety. The preferred usage of the circuit 30 is as a multiple input OR gate, however, it will be understood that under properly controlled conditions, the currents at each input 42 and 43 may be combined to achieve the necessary total current $I_{in}$ sufficient to switch ON circuit 30.

We claim:

1. A three Josephson junction direct coupled isolation OR gate circuit comprising:
   a biasing current source;
   a low reference voltage,
   a first branch electrically connected in series between said biasing current source and said low reference voltage,
   said first branch comprising a first resistor, a first and third Josephson junction in series with said biasing current source and said low reference voltage,
   a signal input node,
   a sink resistor connected between said signal input node and said low reference voltage,
   said sink resistor being connected in parallel with said first Josephson junction,
   a second branch electrically connected in series between biasing current source and said low reference voltage,
   said second branch comprising a second resistor and a second Josephson junction in series between said biasing current source and said low reference voltage,
   a signal output node,
   a load impedance connected between said signal output node and said low reference voltage, and
   said load impedance being connected in parallel with said second Josephson junction,
   said Josephson junction circuit having a biasing current input flowing in said branches before, during and after the presence of an input signal at said signal input node to produce a signal at said signal output node,
   the critical current of said first Josephson junction and the critical current of said third Josephson junction being selectively predetermined to cause switching of said first, second and third Josephson junctions to occur in numerical order of said junctions.

2. A three Josephson junction circuit as set forth in claim 1 wherein the critical currents of said first Josephson junction $I_{01}$ and said critical current of said third Josephson junction $I_{03}$ are substantially equal.

3. A three Josephson junction circuit as set forth in claim 2 wherein said critical currents $I_{01}$ and $I_{03}$ of said first and said third Josephson junctions do not differ by more than fifteen percent.

4. A three Josephson junction circuit as set forth in claim 1 wherein said first resistor $R_1$ and said second resistor $R_2$ satisfies the relationship that the product of the first resistor $R_1$ and the critical current $I_{01}$ of said first Josephson junction is substantially equal to the product of the second resistor $R_2$ and the critical current of said second Josephson junction $I_{02}$.

5. A three Josephson junction circuit as set forth in claim 4 wherein the product of said first resistor $R_1$ and the critical current $I_{01}$ of said first Josephson junction does not differ from the product of the second resistor $R_2$ and the critical current $I_{02}$ of said second Josephson junction by more than fifteen percent.

6. A three Josephson junction circuit as set forth in claim 1 wherein the ratios of the critical current $I_{02}$ of the second Josephson junction to the critical current $I_{01}$ of the first Josephson junction is between 1.70 and 2.87 for acceptable operation.

7. A three Josephson junction circuit as set forth in claim 6 wherein the ratio of the critical current $I_{02}$ of the second Josephson junction to the critical current $I_{01}$ of the first Josephson junction is between 2.0 and 2.5 for optimum operation.

8. A three Josephson junction circuit as set forth in claim 1 wherein the load impedance $R_L$ is at least four times larger than the sink resistance $R_s$.

9. A three Josephson junction circuit as set forth in claim 1 wherein the sink resistance $R_s$ is greater than either said first branch resistance $R_1$ or said second branch resistance $R_2$.

10. A three Josephson junction circuit as set forth in claim 1 wherein the biasing current of said biasing current source $I_b$ is approximately 0.75 times the sum of the critical currents $I_{01}$ and $I_{02}$ of said first and said second Josephson junctions.

11. A three Josephson junction circuit as set forth in claim 10 wherein the biasing current $I_b$ of said current source does not differ by more than fifteen percent for the preferred mode of acceptable operation.

* * * * *